(12) United States Patent
Coimbra et al.

(10) Patent No.: US 9,641,129 B2
(45) Date of Patent: May 2, 2017

(54) LOW POWER CIRCUIT FOR AMPLIFYING A VOLTAGE WITHOUT USING RESISTORS

(71) Applicant: Freescale Semiconductor, Inc., Austin, TX (US)

(72) Inventors: Ricardo Pureza Coimbra, Campinas (BR); André Luis Vilas Boas, Campinas (BR); Alfredo Olmos, Porto Alegre (BR)

(73) Assignee: NXP USA, Inc., Austin, TX (US)

( * ) Notice: Subject to any disclaimer, the term of this patent is extended or adjusted under 35 U.S.C. 154(b) by 49 days.

(21) Appl. No.: 14/855,608

(22) Filed: Sep. 16, 2015

(65) Prior Publication Data

US 2017/0077872 A1    Mar. 16, 2017

(51) Int. Cl.
G05F 3/26 (2006.01)
H03F 1/02 (2006.01)
H03F 1/30 (2006.01)
H03F 3/45 (2006.01)
G05F 1/46 (2006.01)

(52) U.S. Cl.
CPC .......... *H03F 1/0205* (2013.01); *G05F 1/468* (2013.01); *H03F 1/301* (2013.01); *H03F 3/45179* (2013.01); *H03F 2203/45112* (2013.01); *H03F 2203/45116* (2013.01)

(58) Field of Classification Search
CPC . G05F 3/16; G05F 3/225; G05F 3/245; G05F 3/26; G05F 3/262; G05F 3/265; G05F 3/267
USPC ................... 323/313, 315, 316, 907
See application file for complete search history.

(56) References Cited

U.S. PATENT DOCUMENTS

| 4,769,589 | A | | 9/1988 | Rosenthal |
| 5,061,862 | A | | 10/1991 | Tamagawa |
| 5,373,226 | A | * | 12/1994 | Kimura .................. G05F 3/245 323/313 |
| 5,801,524 | A | | 9/1998 | Boerstler |
| 5,818,212 | A | | 10/1998 | Min et al. |
| 5,945,821 | A | * | 8/1999 | Sakurai .................. G05F 3/247 323/313 |
| 6,002,243 | A | | 12/1999 | Marshall |
| 6,040,720 | A | | 3/2000 | Kosiec |
| 6,150,871 | A | | 11/2000 | Yee |
| 6,181,196 | B1 | | 1/2001 | Nguyen |

(Continued)

OTHER PUBLICATIONS

Brito, M., et al., "A 4-Bits Trimmed CMOS Bandgap Reference with an Improved Matching Modeling Design", IEEE International Symposium on Circuits and Systems, May 27-30, 2007, pp. 1911-1914, IEEE, US.

(Continued)

*Primary Examiner* — Jeffrey Sterrett

(57) ABSTRACT

A resistor-less amplifying circuit includes a plurality of resistor-less cells. Each cell includes a plurality of MOS transistors. Each cell generates a differential output equal to $\Delta V_{GS}$ of two MOS transistors with a magnitude of the differential output controlled by a control voltage generated by a differential amplifier coupled to a feedback loop around a cell. In one embodiment, the resistor-less amplifying circuit is a part of a bandgap voltage reference circuit. In another embodiment, the resistor-less amplifying circuit is part of a temperature sensor circuit.

20 Claims, 5 Drawing Sheets

(56) References Cited

U.S. PATENT DOCUMENTS

| | | | |
|---|---|---|---|
| 6,292,050 B1 | 9/2001 | Dooley et al. | |
| 6,384,586 B1 * | 5/2002 | Sugawara | G05F 3/225 |
| | | | 323/313 |
| 6,437,550 B2 * | 8/2002 | Andoh | G05F 3/245 |
| | | | 323/313 |
| 6,518,833 B2 | 2/2003 | Narendra et al. | |
| 6,528,979 B2 * | 3/2003 | Kimura | G05F 3/30 |
| | | | 323/313 |
| 6,724,244 B2 | 4/2004 | Wu | |
| 6,737,909 B2 | 5/2004 | Jaussi et al. | |
| 6,759,893 B2 | 7/2004 | Gailhard et al. | |
| 6,864,741 B2 | 3/2005 | Marsh et al. | |
| 6,919,753 B2 | 7/2005 | Wang et al. | |
| 6,958,597 B1 * | 10/2005 | Lin | G05F 3/262 |
| | | | 323/313 |
| 7,301,321 B1 * | 11/2007 | Uang | G05F 3/262 |
| | | | 323/313 |
| 7,579,898 B2 | 8/2009 | Soldera et al. | |
| 7,755,344 B2 | 7/2010 | Hsieh | |
| 7,872,462 B2 | 1/2011 | Erbito, Jr. | |
| 7,880,533 B2 | 2/2011 | Marinca | |
| 8,305,068 B2 | 11/2012 | Camacho Galeano et al. | |
| 8,330,526 B2 | 12/2012 | Vilas Boas et al. | |
| 8,531,169 B2 | 9/2013 | Marinca | |
| 8,896,349 B2 | 11/2014 | Vilas Boas et al. | |
| 9,385,689 B1 * | 7/2016 | Thakur | H03K 17/223 |
| 2005/0093531 A1 | 5/2005 | Vorenkamp et al. | |
| 2005/0218879 A1 | 10/2005 | Garlapati et al. | |
| 2008/0218253 A1 * | 9/2008 | Pietri | G05F 3/262 |
| | | | 327/543 |
| 2011/0121809 A1 | 5/2011 | Camacho Galeano et al. | |
| 2014/0266139 A1 | 9/2014 | Eberlein | |

OTHER PUBLICATIONS

Buck, A., et al., "A CMOS Bandgap Reference Without Resistors", IEEE Journal of Solid-State Circuits, Jan. 2002, pp. 81-83, vol. 37, No. 1, IEEE, US.

Giustolisi, G., et al., "A Low-Voltage Low-Power Voltage Reference Based on Subthreshold MOSFETs", IEEE Journal of Solid-State Circuits, Jan. 2003, pp. 1-4, vol. 38, No. 1, IEEE, US.

Serra-Graells, G., et al., "Sub-1-V CMOS Proportional-to-Absolute Temperature References", IEEE Journal of Solid-State Circuits, Jan. 2003, pp. 1-5, vol. 38, No. 1, IEEE, US.

* cited by examiner

LOW POWER CIRCUIT FOR AMPLIFYING A VOLTAGE WITHOUT USING RESISTORS

BACKGROUND

Field

This invention relates generally to electronic circuits, and more specifically to amplification of signals in low power consumption circuits.

Related Art

Low power consumption circuits (circuits consuming less than 5 µW) that amplify a small magnitude voltage typically use resistors that have very high ohmic values to maintain low currents. Examples of such low power consumption circuits are low-power voltage reference circuits and low-power temperature sensor circuits. A bandgap voltage reference circuit is a temperature-independent voltage reference circuit that outputs a fixed DC voltage at or near a bandgap voltage of a semiconductor substrate on which the voltage reference circuit resides. The extrapolated bandgap voltage of silicon at zero kelvin is 1.22V.

With most low-power bandgap voltage reference circuits, there is a need to amplify a small signal of a few to tens of millivolts into a larger signal of several hundreds of millivolts. In some known low-power bandgap voltage reference circuits, the small signal that is amplified is a proportional-to-absolute-temperature (PTAT) voltage. If resistors are used in such known circuits, a drop of several hundreds of millivolts across the resistors is needed, which requires resistors having values in the range of tens of megaohms so that the current is limited to nanoamps. Such high ohmic value resistors occupy very large areas, which result in high area cost and/or impose a minimum power constraint. This unfavorable power/area trade-off usually determines a minimum power that can be obtained at an acceptable area cost.

Several low-power bandgap voltage reference circuits that do not use resistors, and instead use metal-oxide-semiconductor (MOS) transistors, are known. However such known circuits do not provide sufficient linearity because of the presence of various error sources such as second-order effects. Furthermore, such known circuits are subject to fabrication process and spread. Also, such known circuits require extensive trimming. Consequently, such known circuits are much less accurate than conventional bandgap voltage reference circuits that employ resistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Circuits in accordance with embodiments of the present invention employ compact structures, or cells, comprising metal-oxide-semiconductor (MOS) transistors instead of resistors to amplify a small magnitude signal. Embodiments may amplify a small magnitude PTAT voltage. However, circuits in accordance with the present invention do not use MOS transistors to produce a PTAT voltage. Instead, embodiments of the present invention use two bipolar junction transistors (BJTs) to produce the PTAT voltage, as done with high-precision bandgap voltage reference circuits. Circuits in accordance with the present invention use stacked cells of MOS transistors that are actively controlled (using a closed-loop structure) to accurately replicate the small magnitude signal.

A circuit in accordance with the present invention adjusts, through feedback, a difference between gate-to-source voltages of two MOS transistors. A feedback loop around one cell forces a difference between gate-to-source voltages of two MOS transistors in the cell to become equal to a small magnitude voltage that is inputted into the cell. A control voltage produced by the feedback loop is applied to all other cells in the circuit. Each cell then produces a copy of the small magnitude voltage input signal. The individual cells are cascaded in order to build an amplified copy of the small magnitude voltage.

Figure 1:
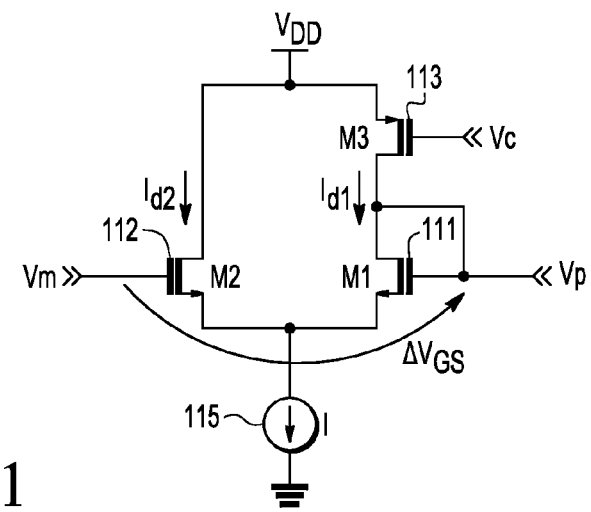
FIG. 1 is a schematic of a first type of cell comprising MOS transistors, in accordance with one embodiment of the present invention.

FIG. 1 is a schematic of a first type of cell 102 comprising MOS transistors. The cell 102 comprises MOS transistor M1 111 configured as a diode, MOS transistor M2 112, and MOS transistor M3 113. A drain terminal of MOS transistor M2 112 is coupled to $V_{DD}$ and a source terminal of MOS transistor M2 is coupled to a current source 115. A voltage $V_m$ is present at the gate of MOS transistor M2 112. A source terminal of MOS transistor M3 113 is coupled to $V_{DD}$ and a drain terminal of MOS transistor M3 is coupled to drain and gate terminals of MOS transistor M1 111. A control voltage $V_C$ is inputted to the gate of MOS transistor M3 113. A source terminal of MOS transistor M1 111 is coupled to the current source 115. A voltage $V_p$ is present at the gate of MOS transistor M1 111. A voltage defined as a difference between $V_p$ and $V_m$ may be considered to be the output of the cell 102. The following relationship exists in cell 102: $V_p - V_m = V_{GS1} - V_{GS2} = \Delta V_{GS}$. The cell 102 does not include any BJTs. Advantageously, the cell 102 does not include any resistors. When used alone, the cell 102 receives, as an input, the control voltage $V_C$, and then the cell produces, as an output, the voltage $(V_p - V_m)$. Because the gates of M1 111 and M2 112 are floating with respect to $V_{DD}$ and ground, a plurality of the cells 102 can be cascaded, or stacked, as shown in FIGS. 4-7.

Figure 2:
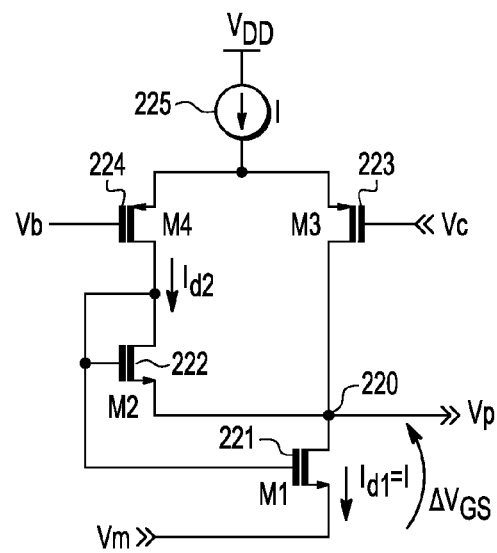
FIG. 2 is a schematic of a second type of cell comprising MOS transistors, in accordance with one embodiment of the present invention.

FIG. 2 is a schematic of a second type of cell 202 comprising MOS transistors. The cell 202 comprises MOS transistor M1 221, MOS transistor M2 222 configured as a diode, MOS transistor M3 223, and MOS transistor M4 224. A source terminal of MOS transistor M3 223 is coupled to a current source 225. A drain terminal of MOS transistor M3 223 is coupled to a node 220. The control voltage $V_C$ is inputted at the gate of MOS transistor M3 223. A source terminal of MOS transistor M4 224 is coupled to the current source 225. A drain terminal of MOS transistor M4 224 is coupled to gate and drain terminals of a MOS transistor M2 222 and to a gate of a MOS transistor M1 221. A bias voltage $V_B$ is inputted at the gate of MOS transistor M4 224. A source terminal of MOS transistor M2 222 is coupled to the node 220. A drain terminal of MOS transistor M1 221 is also coupled to the node 220. A voltage $V_p$ is present at the node 220. A voltage $V_m$ is present at a source terminal of MOS transistor M1 221. A voltage defined as a difference between $V_p$ and $V_m$ may be considered to be the output of the cell 202. The following relationship exists in cell 202: $V_p - V_m = V_{GS1} - V_{GS2} = \Delta V_{GS}$. The cell 202 does not include any BJTs. Advantageously, the cell 202 does not include any resistors. Because the gates of M1 221 and M2 222 are floating with respect to $V_{DD}$ and ground, a plurality of the cells 202 can be cascaded, or stacked. When the cell 202 is used as part of a larger circuit, as described hereinafter, the source terminal of MOS transistor M1 221 is also coupled to other circuitry including to ground potential. When used alone, the cell 202 receives, as an input, the control voltage $V_C$, and then the cell 202 produces, as an output, the voltage $(V_p - V_m)$.

In the illustrated embodiments, MOS transistors M1 and M2 are of a same size, and a gate-to-source ($V_{GS}$) voltage difference between MOS transistors M1 and M2 is adjusted by controlling a relationship between their drain currents, to obtain the desired $\Delta V_{GS} = \Delta V_{BE}$. In the illustrated embodiments, the drain current of M1 is larger than the drain current of M2 in order to produce $V_{GS1} - V_{GS2} = \Delta V_{BE}$ ($V_{GS1}$ is greater than $V_{GS2}$). In another embodiment, MOS transistors M1 and M2 have same drain currents and have different W/L ratios to obtain the desired $\Delta V_{GS} = \Delta V_{BE}$. In yet another embodiment, MOS transistors M1 and M2 have different drain currents and different W/L ratios to obtain the desired $\Delta V_{GS} = \Delta V_{BE}$.

Figure 3:
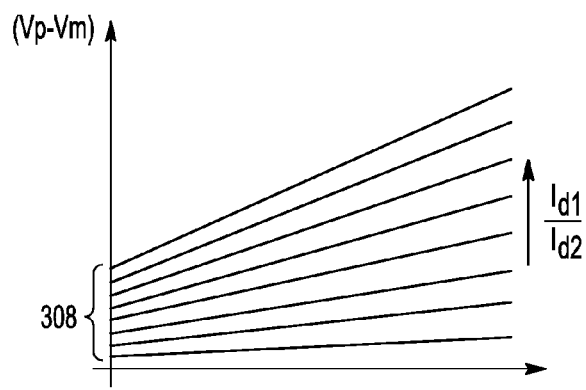
FIG. 3 is a graph of a family of differential outputs of a cell, such as the cell of FIG. 1 or FIG. 2.

FIG. 3 is a graph of a family of differential outputs of a cell, such as cell 102 or cell 202. In the graph of FIG. 3, the vertical, or y-axis, represents voltage and the horizontal, or x-axis, represents temperature. FIG. 3 shows how a voltage $(V_p - V_m)$ changes with respect to temperature for eight (8) different values of $I_{d1}/I_{d2}$. Other values of $I_{d1}/I_{d2}$ are possible, but only eight (8) representative values of values of $I_{d1}/I_{d2}$ are shown in FIG. 3, for simplicity of illustration. FIG. 3 shows that, for each representative value of $I_{d1}/I_{d2}$, $(V_p - V_m)$ increases with temperature. Because the graph of each voltage versus temperature appears in FIG. 3 as almost a straight line, it can be concluded that the voltage $(V_p - V_m)$ has nearly PTAT behavior for a given $I_{d1}/I_{d2}$. The graph of FIG. 3 shows a range 308 of values of $I_{d1}/I_{d2}$ over which $\Delta V_{GS}$ may be adjusted using the control voltage V. In one embodiment, the range 308 is 600 mV.

By controlling $V_C$, the ratio $I_{d1}/I_{d2}$ can be controlled. The ratio $I_{d1}/I_{d2}$, in turn, adjusts $\Delta V_{GS}$. There is a range 308 over which $\Delta V_{GS}$ may be successfully adjusted through $V_C$. For proper operation, $(V_p - V_m)$ must fall within the range 308 over which $\Delta V_{GS}$ may be successfully adjusted. $\Delta V_{GS}$ can be adjusted to any value within the range 308 by controlling $I_{d1}/I_{d2}$. A top limit of the range 308 corresponds to a $\Delta V_{GS}$ produced with a maximum $I_{d1}/I_{d2}$ that is practical to implement. The behavior shown on the graph of FIG. 3 is basically the same for all cases of I (for the various MOS operation region cases) with some change only in the y-axis values. Nevertheless, for any given case, provided that $(V_p - V_m)$ falls within the range 308, $\Delta V_{GS}$ can be made equal to $(V_p - V_m)$ by feedback, as explained hereinbelow with regard to FIGS. 4-7.

The graph of FIG. 3 shows that $V_p - V_m$ is nearly PTAT and that $(V_p - V_m)$ increases almost linearly with temperature for a given $I_{d1}/I_{d2}$. Provided that $(V_p - V_m)$ falls within the range 308, the graph of FIG. 3 can be obtained even if one of M1 and M2 is operated in strong inversion and the other of M1 and M2 is operated in weak or moderate inversion.

When used in a resistor-less amplifying circuit, the cells 102 and 202 are particularly suitable to track a nearly-PTAT small magnitude input signal because a nearly-PTAT signal requires smaller variations of $I_{d1}/I_{d2}$ over temperature compared to when a signal is not nearly-PTAT. The circuits in accordance with the embodiment are particularly suitable to track a nearly-PTAT small magnitude input signal also because the $\Delta V_{GS}$ output of each cell 102 and 202 is, by its design, nearly-PTAT when a constant ratio between the MOS transistor currents (a mid-point in the control range) is maintained.

Figure 4:
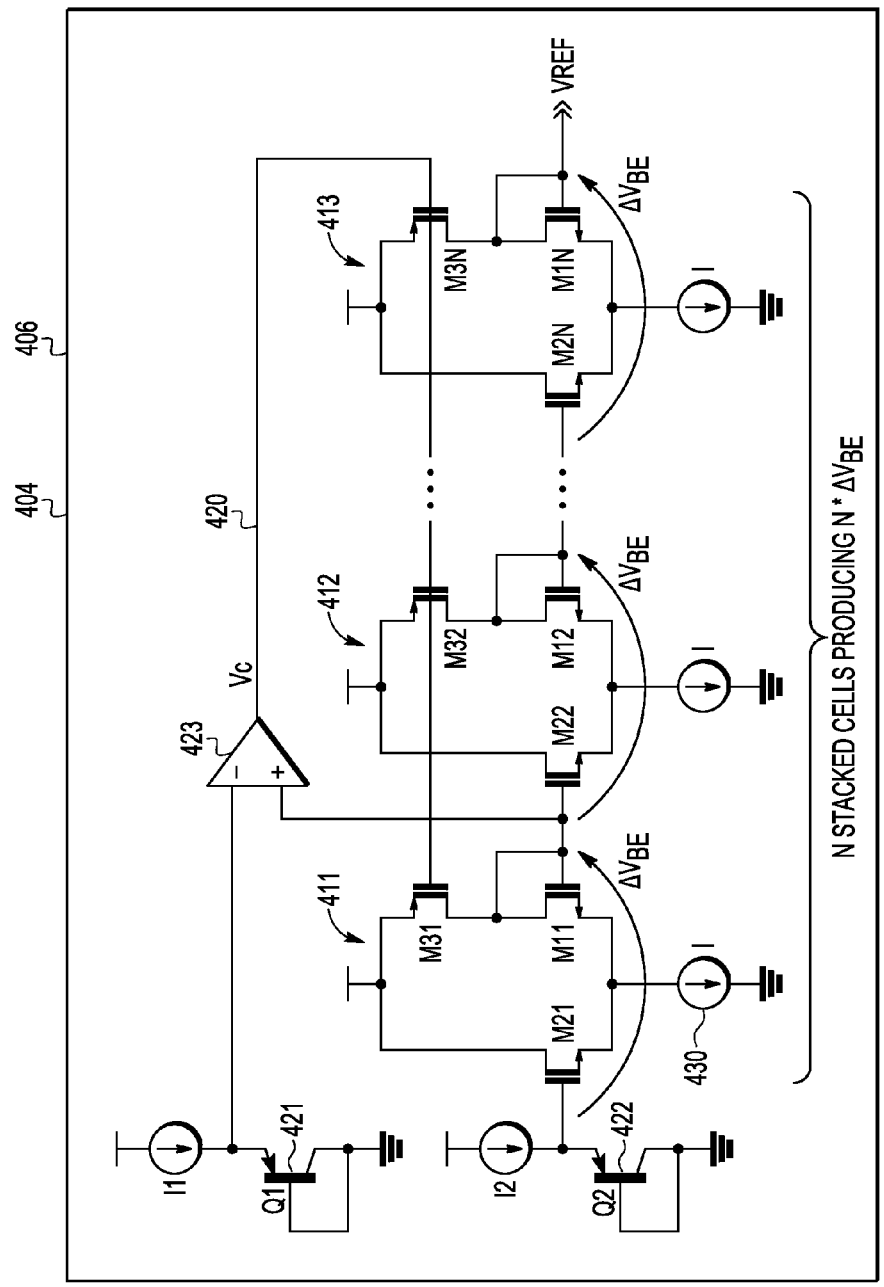
FIG. 4 is a schematic of a low power consumption bandgap voltage reference circuit in accordance with one embodiment of the present invention.

FIG. 4 is a schematic of a low power consumption bandgap voltage reference circuit 402 in accordance with one embodiment of the present invention. In one embodiment, the bandgap voltage reference circuit 402 is implemented as an integrated circuit 404 disposed on a silicon substrate 406. The bandgap voltage reference circuit 402 includes BJT Q1 421 and BJT Q2 422. The bandgap voltage reference circuit 402 also includes a resistor-less amplifying circuit coupled to the aforesaid BJTs. In the illustrated embodiment, the BJTs provide a small magnitude signal to the resistor-less amplifying circuit. The resistor-less amplifying circuit amplifies the small magnitude signal. The resistor-less amplifying circuit comprises a plurality of the first type of cell 102. The resistor-less amplifying circuit also comprises a closed-loop structure, or feedback loop 420, as described hereinbelow. In the illustrated embodiment of the bandgap voltage reference circuit 402, three cells are shown: a first cell 411, a second cell 412 and an $n^{th}$ cell 413. Each cell 411, 412 and 413 has an identical structure and is identically biased. The cells of the bandgap voltage reference circuit 402 are stacked, or cascaded together, such that a differential voltage that occurs at each cell can be added together. A sum of the differential voltage that occurs at each cell contributes to an output signal, $V_{REF}$, of the bandgap voltage reference circuit 402.

An emitter terminal of BJT Q1 421 is coupled to a current source I1. Base and collect terminals of BJT Q1 421 are coupled to ground. An emitter terminal of BJT Q2 422 is coupled to a current source I2. Base and collect terminals of BJT Q2 422 are coupled to ground. The base-to-emitter voltage of BJT Q1 421 ($V_{BE1}$) depends upon a value of I1 and a size of Q1. The base-to-emitter voltage of BJT Q2 422 ($V_{BE2}$) depends upon a value of I2 and a size of Q2. $\Delta V_{BE} = V_{BE1} - V_{BE2}$. In the bandgap voltage reference circuit 402, $\Delta V_{BE}$ has PTAT behavior. To generate a $\Delta V_{BE}$ that has PTAT behavior, it is necessary that Q1 and Q2 be of different sizes and/or that I1 and I2 have different values. In one embodiment, Q2 is larger than Q1, and I1=I2. In one such embodiment, Q2 is 8 to 25 times larger than Q1.

In the bandgap voltage reference circuit 402, the feedback loop 420 goes around the first cell 411. The feedback loop 420 includes a differential amplifier 423. An inverting input terminal of the differential amplifier 423 is coupled to an emitter terminal of BJT Q1 421 at which the voltage $V_{BE1}$ is obtained. A non-inverting input terminal of the differential amplifier 423 is coupled to a gate of MOS transistor M11. An output terminal of the differential amplifier 423 is coupled to a gate of MOS transistor M31. The output terminal of the differential amplifier 423 is also coupled to a gate of a MOS transistor in each of the other cells that corresponds to MOS transistor M31 in the first cell 411. Control voltage $V_C$ is outputted by the differential amplifier 423. The gain of the feedback loop 420 is selected to be high enough so that a systematic offset can be neglected. A voltage difference between the non-inverting and the inverting input terminals of the amplifier 421 represents the systematic offset.

A small magnitude differential voltage is applied to the first cell 411 of the resistor-less amplifying circuit as an input signal thereto. More specifically, one end of the small magnitude differential voltage is applied at the inverting input terminal of the differential amplifier 423 and the other end of the small magnitude differential voltage is applied at the gate of MOS transistor M21. When an input signal is applied to the first cell 411, the bandgap voltage reference circuit 402 produces a value of $V_C$ as a result of the feedback loop 420. In the illustrated embodiment, BJT Q1 421 and BJT Q2 422 produce the small magnitude differential signal.

The small magnitude differential signal that BJT Q1 421 and BJT Q2 422 produce is $\Delta V_{BE}$. For purposes of analysis, it should be noted that the first cell 411 of the bandgap voltage reference circuit 402 has a differential voltage that consists of a difference between a gate-to-source voltage of MOS transistor M11 and a gate-to-source voltage of MOS transistor M12, i.e., $\Delta V_{GS}$. A magnitude of $\Delta V_{GS}$ is modifiable by a value of $V_C$, which is coupled to the gate of M31 of the first cell 411. By feedback, the differential voltage $\Delta V_{GS}$ at the first cell 411 is adjusted to become equal to $\Delta V_{BE}$. In other words, the feedback loop 420 determines a particular value of $V_C$ that causes $\Delta V_{GS}$ to equal $\Delta V_{BE}$ at the first cell 411.

$V_{BE2}$, which has complementary-to-absolute-temperature (CTAT) behavior, is applied to the gate of MOS transistor M21. The feedback loop 420 causes $V_{BE1}$ to occur at the gate of MOS transistor M11. If $V_{BE1}$ is higher than the gate voltage of M11, then $V_C$ will decrease, which means that $V_{GS}$ of M31 will increase, so that the current through M31 will increase. As the current through M31 increases, M11 drains more current and produces a higher $V_{GS}$ for M11. Therefore, the gate of M11 increases until the gate voltage of M11 equals $V_{BE1}$.

By adjusting a gate voltage of M31, the feedback loop 420 forces $\Delta V_{GS}$ between M11 and M21 to equal the difference between the base-to-emitter voltages of the BJTs, Q1 421 and Q2 422. In other words, the feedback loop 420 forces $\Delta V_{GS}$ to become equal $\Delta V_{BE}$ for the first cell 411. Therefore, as a result of feedback, a voltage at the gate of M11 with respect to ground is $V_{BE2}$ $\Delta V_{BE}$.

The particular value of $V_C$ that forced $\Delta V_{GS}$ to become equal to $\Delta V_{BE}$ in the first cell 411 is then applied to each of the other cells, including cell 412 and cell 413, in a similar manner, and each of the other cells will create its own $\Delta V_{GS}$ $\Delta V_{BE}$. By applying the particular value of $V_C$ to a gate of a MOS transistor in each cell that corresponds to M31, $\Delta V_{GS}$ in all the other cells in the bandgap voltage reference circuit 402 also become equal to $\Delta V_{BE}$. The gate of MOS transistor M11 of cell 411 is coupled to the gate of MOS transistor M22 of cell 412, thereby allowing the differential voltage that occurs across cell 411 to be added to the differential voltage that occurs across cell 412. As a result, a voltage at the gate of M12 with respect to ground is $V_{BE2}+2 \cdot \Delta V_{BE}$. Consequently, a voltage produced across the entire stack of cells becomes an amplified version of $\Delta V_{BE}$. The other cells are coupled together in an analogous manner, thereby allowing the N stacked cells of the resistor-less amplifying circuit to produce a voltage equal to $N \cdot \Delta V_{BE}$. The voltage $N \cdot \Delta V_{BE}$ is part of the voltage outputted by the bandgap voltage reference circuit 402. The other part of the voltage outputted by the bandgap voltage reference circuit 402 is $V_{BE2}$. When N cells are stacked, as in the bandgap voltage reference circuit 402, the output voltage $V_{REF}$ of the bandgap voltage reference circuit with respect to ground becomes $V_{BE2}$ plus the sum of N voltages, each voltage being $\Delta V_{BE}$. In other words, $V_{REF}=V_{BE2}+N \cdot \Delta V_{BE}$. Consequently, the output voltage $V_{REF}$ can be looked upon as $V_{BE2}$ plus the product of $\Delta V_{BE}$ multiplied by an integer.

Typical N=8 for low-power designs of the bandgap voltage reference circuit 402. Because N is integer, changing only N results in a gross adjustment to the value of $V_{REF}$ and to the behavior of $V_{REF}$ with respect to temperature. After choosing an appropriate N, fine tuning of $V_{REF}$ is done by adjusting collector currents of BJT Q1 421 and BJT Q2 422 to set appropriate thermal coefficients for $V_{BE2}$ and $\Delta V_{BE}$. $\Delta V_{BE}$ is very linear over temperature. $\Delta V_{BE}$ can be written as a function of the absolute temperature T as $\Delta V_{BE}=C*T$. $V_{BE}$ can also be written as a function of the absolute temperature T as $V_{BE}=A-B*T$. The parameter A is a constant, i.e., it does not depend on biasing currents. The parameters B and C depend on biasing currents, and these parameters are first-order thermal coefficients. Reasonable values of biasing currents would typically make B about 2 mV/K and C about 0.2 mV/K. In other words, by adjusting the biasing currents B and C can be adjusted to any real value near the aforesaid reasonable values. Considering $V_{BE2}=A-B*T$ and $\Delta V_{BE}=C*T$ as written above, and given $V_{REF}=V_{BE2}+N*\Delta V_{BE}$, then it follows that $V_{REF}=A+(N*C-B)*T$. To have no variation over temperature, values are chosen such that N*C=B. When N*C=B is substituted into the preceding equation, the results is $V_{REF}=A$ (bandgap reference). Because N is an integer, B needs to be a multiple of C in order to make N*C=B. The parameter B is made a multiple of C by adjusting the biasing currents, i.e., adjusting B and C values.

When implementing bandgap voltage reference circuit 402, I1 and I2 are varied so that $N \times \Delta V_{BE}$ rises with temperature (PTAT behavior) at a same rate that $V_{BE2}$ decays with temperature (CTAT behavior). First, it is determined which current density values to apply to BJT Q1 421 and BJT Q2 422 based on technology curves, power constraints, and other factors. Then, the values of B and C are obtained from the current densities. Next, the current density values are adjusted to make B a multiple of C, i.e., B/C=N. The value of N determines the number of cells needed to produce $V_{REF}$.

For minimum power consumption, BJT Q1 421 and BJT Q2 422 are selected to be of minimum sizes (and equal areas), and I1 is selected to be greater than I2 (e.g., I1=24× I2). However, for a simple implementation I1=I2, and emitter area of Q2>>emitter area of Q1.

Figure 5:
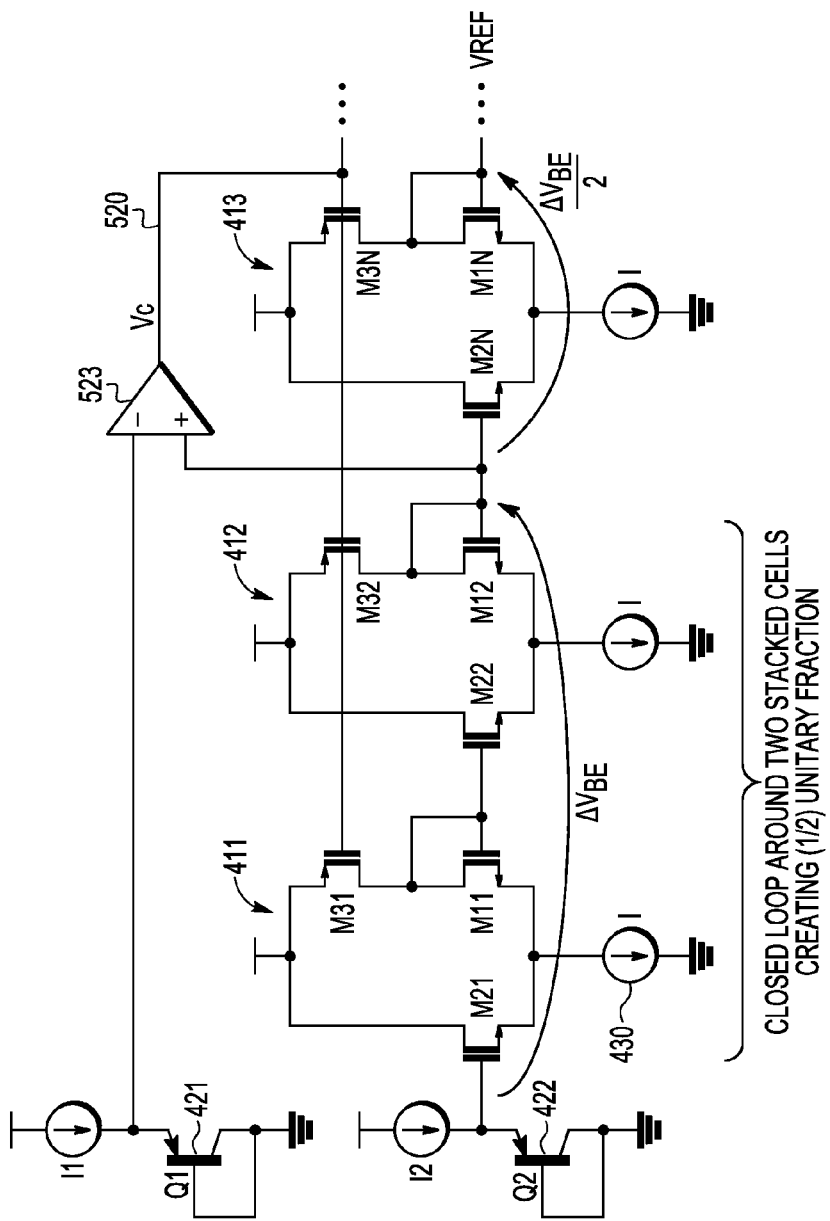
FIG. 5 is a schematic of a low power consumption bandgap voltage reference circuit in accordance with another embodiment of the present invention.

FIG. 5 is a schematic of a low power consumption bandgap voltage reference circuit 502 in accordance with another embodiment of the present invention. In most respects, the bandgap voltage reference circuit 502 is similar to the bandgap voltage reference circuit 402; therefore, only the differences will be emphasized hereinafter.

In the bandgap voltage reference circuit 402 (see FIG. 4), scaling of $\Delta V_{BE}$ was by an integer factor. However, in the bandgap voltage reference circuit 502 (see FIG. 5), scaling is done by a non-integer factor notwithstanding N being an integer. To accomplish scaling by a non-integer factor, a single feedback loop 520 is closed around K number of cells in order to generate input signal copies scaled by (1/K), where K is an integer greater than 1 and less than N, and where N is a total number of cells in the bandgap voltage reference circuit 502. In the bandgap voltage reference circuit 502, the feedback loop 520 is around two cells. Therefore, for the bandgap voltage reference circuit 502, K=2.

In the illustrated embodiment of the bandgap voltage reference circuit 502, three cells are shown: a first cell 411, a second cell 412 and an nth cell 413. The bandgap voltage reference circuit 502 includes the feedback loop 520 around both the first cell 411 and the second cell 412. The feedback loop 520 includes a differential amplifier 523. An inverting input terminal of the differential amplifier 523 is coupled to an emitter terminal of BJT Q1 421 at which the voltage $V_{BE1}$ is obtained. A non-inverting input terminal of the differential amplifier 523 is coupled to a gate of MOS transistor M12 of cell 412. The output terminal of the differential amplifier 523 is coupled to a gate of MOS transistor M31, M32, . . . , M3N in each cell. Control voltage $V_C$ is outputted by the differential amplifier 523. The gain of the feedback loop 520 is selected to be high enough so that the systematic offset can be neglected.

A feedback loop around K cells creates a 1/K fraction of $\Delta V_{BE}$. The feedback loop 520 forces $\Delta V_{GS}+\Delta V_{GS}=\Delta V_{BE}$. As a result, each cell 411 and 412 copies 1/2 $\Delta V_{BE}$. Therefore, if the total number of cells in the bandgap voltage reference circuit 502 was three, i.e., N=3, then the output $V_{REF}$ would be $V_{BE2}$ plus 3/2 $\Delta V_{BE}$. Consequently, if the bandgap voltage reference circuit 502 had three (3) cells, the signal $\Delta V_{BE}$ would be multiplied by a non-integer.

If instead, the total number of cells in the bandgap voltage reference circuit 502 was four, i.e., N=4, the output $V_{REF}$ would be $V_{BE2}$ plus 4/2 $\Delta V_{BE}$. Consequently, if the bandgap voltage reference circuit 502 had four (4) cells, the signal $\Delta V_{BE}$ would be multiplied by an integer.

If instead, the total number of cells in the bandgap voltage reference circuit 502 was five, i.e., N=5, the output $V_{REF}$ would be $V_{BE2}$ plus 5/2 $\Delta V_{BE}$. Consequently, if the bandgap voltage reference circuit 502 had five cells, the signal $\Delta V_{BE}$ would be multiplied by a non-integer.

If the total number of cells in another bandgap voltage reference circuit (not shown) was five, i.e., N=5, and if such other circuit had a similar feedback loop closed around three cells (instead of two cells) but was otherwise similar to FIG. 5, the feedback loop would force $\Delta V_{GS}+\Delta V_{GS}+\Delta V_{GS}=\Delta V_{BE}$. Each cell in such other circuit would copy 1/3 $\Delta V_{BE}$. Therefore, the output $V_{REF}$ of such other circuit would be $V_{BE2}$ plus 5/3 $\Delta V_{BE}$.

An advantage, under certain circumstances, of closing the feedback loop 520 around more than one cell is the feedback having a more accurate effect compared to when a feedback loop is closed around only one cell.

FIGS. 4 and 5 show that $V_{REF}$ is taken at the output of the rightmost cell. However, taking $V_{REF}$ from one of the nodes between the cells can be a way of implementing coarse trimming of $V_{REF}$.

Figure 6:
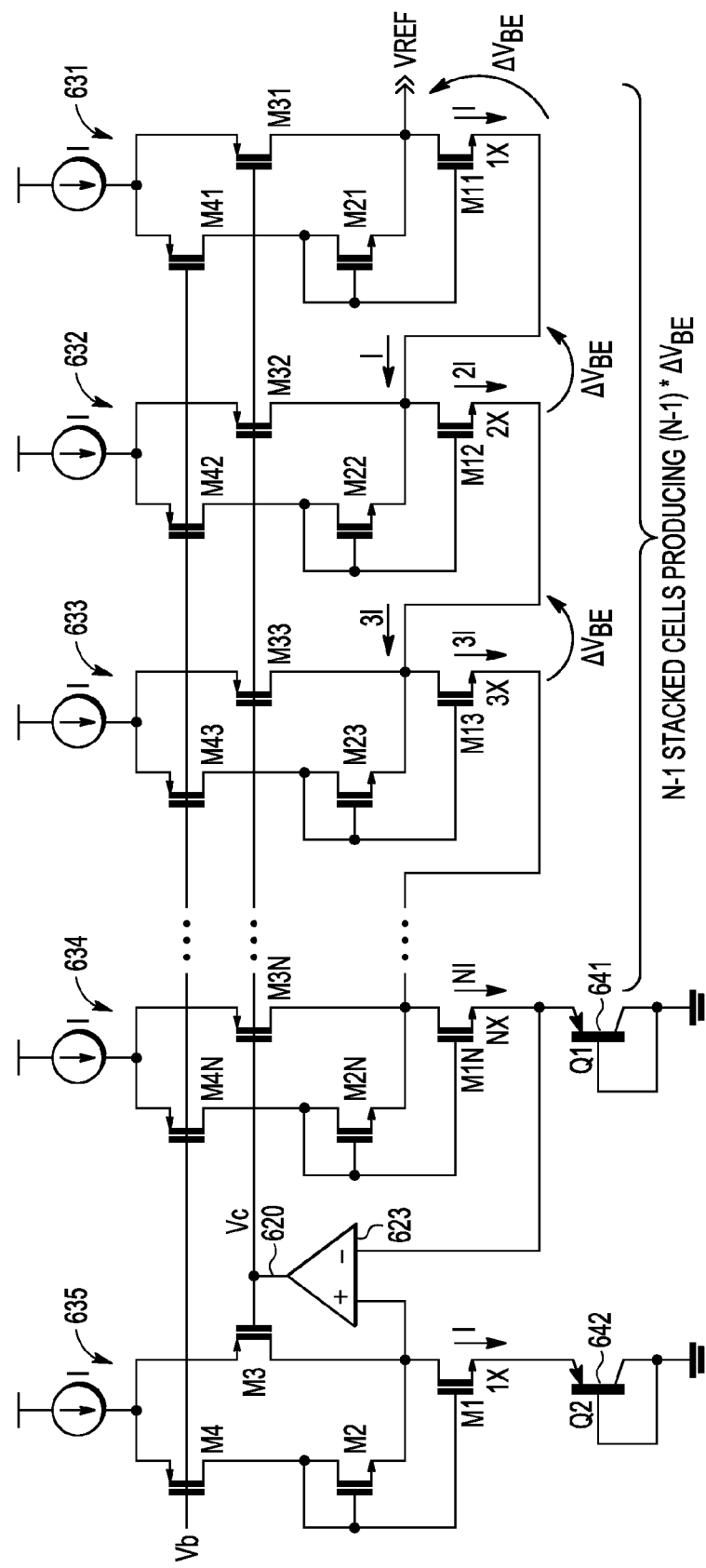
FIG. 6 is a schematic of a low power consumption bandgap voltage reference circuit in accordance with yet another embodiment of the present invention.

FIG. 6 is a schematic of a low power consumption bandgap voltage reference circuit 602 in accordance with yet another embodiment of the present invention. The bandgap voltage reference circuit 602 comprises a plurality of the second type of cell 202 each of which is described in detail hereinabove with respect to FIG. 2. Each cell 631, 632, 633, 634 and 635 of the bandgap voltage reference circuit 602 has an identical structure (except for MOS transistors M11, M12, M13, . . . , M1N) and is identically biased. In the bandgap voltage reference circuit 602, MOS transistors M11, M12, M13, . . . , M1N conduct currents I, 2I, 3I, . . . , NI. Hence, parallel transistors are added (1×, 2×, 3×, . . . , N×) to maintain current I through the unitary MOS transistors of each cell.

In the illustrated embodiment of the bandgap voltage reference circuit 602, five cells are shown, which are, from right to left in FIG. 6: cell 631, cell 632, cell 633, an $n^{th}$ cell 634 and an initial cell 635. The bandgap voltage reference circuit 602 includes a feedback loop 620 around the initial cell 635. The feedback loop 620 includes a differential amplifier 623. A non-inverting input terminal of the differential amplifier 623 is coupled to a drain terminal of MOS transistor M1. An inverting input terminal of the differential amplifier 623 is coupled to an emitter terminal of BJT Q1 641 at which $V_{BE1}$ is present. An output terminal of the differential amplifier 623 is coupled to a gate of MOS transistor M3. The differential amplifier 623 outputs control voltage $V_C$. For purposes of analysis, it can be considered that an input signal is applied between source and drain terminals MOS transistor M1 of the initial cell 635. The control voltage $V_C$ is applied to a gate of M3. Because of feedback, the closed-loop structure of the bandgap voltage reference circuit 602 produces a $V_C$ that has a particular value. As a result of the particular value of $V_C$ controlling a gate voltage of MOS transistor M3, the feedback loop forces $\Delta V_{GS}$ between MOS transistors M1 and M2 to equal the difference between the base-to-emitter voltages of the BJTs, Q1 641 and Q2 642. In other words, the feedback loop 620 forces $\Delta V_{GS}$ to equal $\Delta V_{BE}$ for the initial cell 635. Because the particular value of $V_C$ that forced $\Delta V_{GS}=\Delta V_{BE}$ in the initial cell 635 is also applied to each of the other cells in a similar manner, then each of the other cells creates a $\Delta V_{GS}=\Delta V_{BE}$ of their own.

The (N−1) stacked cells (for example, cell 631, cell 632 and cell 633) of FIG. 6 produce a voltage of (N−1)·$\Delta V_{BE}$. Therefore, $V_{REF}=V_{BE1}+N·\Delta V_{BE}=V_{BE2}+(N+1)·\Delta V_{BE}$.

All the current consumed by the bandgap voltage reference circuit 602 goes eventually to the BJTs Q1 641 and Q2 642. In other words, no current goes to ground without first going through the BJTs 641 and 642. This means that the bandgap voltage reference circuit 602 consumes the lowest possible current. When designing the bandgap voltage reference circuit 602, a first step is to determine which value of current is needed to bias Q1 and Q2. Then, the biasing of the MOS transistors is determined.

For very low power designs, it is advantageous that the BJTs 641 and 642 do not have their own, additional, current sources that consume power. Compared to embodiment shown in FIGS. 4 and 5, the embodiment shown in FIG. 6 enables lower power consumption for the same BJT bias conditions. However, if the MOS transistors are operated in strong inversion, then the bandgap voltage reference circuits 402 and 502 may be advantageous over the bandgap voltage reference circuit 602.

Corner and mismatch simulations of the bandgap voltage reference circuit 602 shows that $V_{REF}$ is 1.20V+10 mV after trimming for temperatures between −40° C. and 150° C., and that the maximum current consumption is 502 nA at 150° C. and 5.5V supply. Typical-case simulation of the bandgap voltage reference circuit 602 shows that $V_{REF}$ is 1.201V+1.1 mV for temperatures between −40° C. and 150° C., and that the current consumption is 250 nA at 25° C. and 5V supply. The simulations reveal that $V_{REF}$ outputted by the bandgap voltage reference circuit 602 is almost equal to the bandgap voltage of silicon and is nearly temperature independent.

On a given technology, the bandgap voltage reference circuits 402, 502 and 602 can be made as accurate as a conventional bandgap voltage reference circuit that employs resistors. The accuracy of the bandgap voltage reference circuits 402, 502 and 602 is dependent upon matching of corresponding MOS transistors in each cell are matched.

Figure 7:
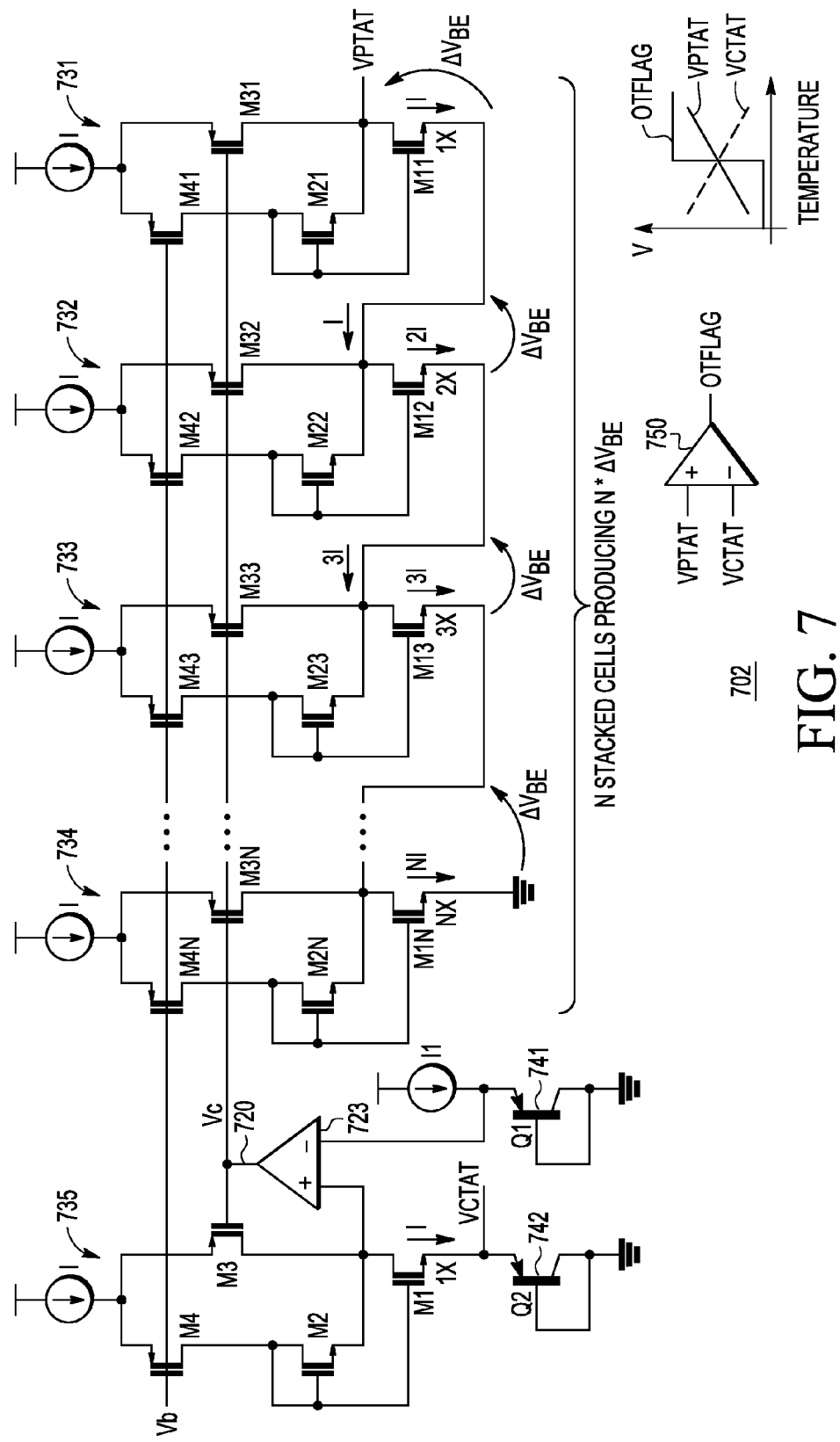
FIG. 7 is a schematic of a low power consumption temperature sensor circuit in accordance with one embodiment of the present invention.

FIG. 7 is a schematic of a low power consumption temperature sensor circuit 702 in accordance with one embodiment of the present invention. The temperature sensor circuit 702 uses BJTs to produce highly accurate temperature-related signals and uses cells of matched MOS transistors to amplify those signals. The temperature sensor circuit 702 comprises a plurality of the second type of cell 202. In the illustrated embodiment of the temperature sensor circuit 702, five cells are shown, which are, from right to left in FIG. 7: cell 731, cell 732, cell 733, an $n^{th}$ cell 734 and an initial cell 735. Each cell 731, 732, 733, 734 and 735 of the temperature sensor circuit 702 has an identical structure (except for MOS transistors M11, M12, M13, . . . , M1N) and is identically biased. In the temperature sensor circuit 702, MOS transistors M11, M12, M13, . . . , M1N conduct currents I, 2I, 3I, . . . , NI. Hence, parallel transistors are added (indicated by 1×, 2×, 3×, . . . , N× in FIG. 7) to MOS transistors M11, M12, M13, . . . , M1N to maintain a same current I through the unitary MOS transistors of each cell.

The temperature sensor circuit 702 includes a feedback loop 720 around the initial cell 735. The temperature sensor circuit 702 uses the feedback loop 720 for precise replication of a voltage created by BJT Q1 741 and BJT Q 742. The feedback loop 720 includes a differential amplifier 723. A non-inverting input terminal of the differential amplifier 723 is coupled to a drain terminal of MOS transistor M1. An inverting input terminal of the differential amplifier 723 is coupled to an emitter terminal of BJT Q1 741 at which $V_{BE1}$ is present. An output terminal of the differential amplifier 723 is coupled to a gate of MOS transistor M3. The differential amplifier 723 outputs control voltage $V_C$. The gain of the feedback loop 720 is selected to be high enough so that the systematic offset can be neglected. In most respects, the temperature sensor circuit 702 is similar to the bandgap voltage reference circuit 602; therefore, only the differences will be emphasized hereinafter.

In the temperature sensor circuit 702, MOS transistor M1N is stacked on top of ground potential rather than stacked on top of a BJT (as in the bandgap voltage reference circuit 602). In the temperature sensor circuit 702, the stack of cascaded cells is referenced to ground to create a PTAT output. As a result, the output, $V_{PTAT}$, is a voltage that is proportional to temperature. In the temperature sensor circuit 702, $V_{PTAT}=N \cdot \Delta V_{BE}$ because the N stacked cells start at ground potential, i.e., the source terminal of MOS transistor M1N is at ground potential.

With the temperature sensor circuit 702, a threshold is detectable at a crossing between $V_{BE}$ and $N \cdot \Delta V_{BE}$ signals.

In one embodiment, $V_{PTAT}$ is coupled to a non-inverting input terminal of a comparator 750. Another voltage $V_{CTAT}$, such as $V_{BE}$ of BJT Q2 742, is coupled to an inverting input terminal of the comparator 750. The comparator 750 toggles an over-temperature flag $OT_{FLAG}$ when $V_{PTAT}$ and $V_{CTAT}$ have a same value.

In another embodiment (not shown), a temperature sensor circuit, which is otherwise similar to the temperature sensor circuit 702, is built using the first type of cell 102 instead of the second type of cell 202; however, in such other embodiment, the MOS transistors are re-oriented and there is polarity changed in a manner known by a person skilled in the art.

To be technically accurate, $V_{GS}$, used hereinabove, should be interpreted to mean $|V_{GS}|$, and $V_{BE}$, used hereinabove, should be interpreted to mean $|V_{BE}|$. This is because, for PMOS transistors and PNP BJTs, $V_{SG}$ ($V_{SG}=V_S-V_G$) instead of $V_{GS}$, and $V_{EB}$ ($V_{EB}=V_E-V_B$) instead of $V_{BE}$, respectively, should be used to represent positive voltages.

Each of the circuits in accordance with the present invention is implemented, in one embodiment, as an integrated circuit disposed on a silicon substrate.

In another embodiment (not shown), the circuits in accordance with the present invention can be used to amplify any differential voltage signal including those that are not related to BJTs, provided that such differential voltage signal falls within the range 308 shown in FIG. 3.

In another embodiment (not shown), the circuits in accordance with the present invention can be used to amplify a single-ended signal because a single-ended signal can be viewed as a differential voltage with respect to ground potential or $V_{DD}$.

Advantageously, the behavior of the output of the circuits in accordance with the present invention is not significantly dependent on MOS transistor operation region or process corners provided that a magnitude of $\Delta V_{BE}$ is within a range over which $\Delta V_{GS}$ may adjusted through control voltage $V_C$.

Advantageously, the circuits in accordance with the present invention are not sensitive to MOS transistor parameters other than matching of MOS transistors, and, therefore, are not subject to some of the sources of distortion that adversely affect known circuits.

Advantageously, the circuits in accordance with the present invention compensate for systematic offsets (process deviations, model inaccuracies, etc.).

Compared to known circuits that employ resistors, the circuits in accordance with the present invention improve a power/area trade-off for low-power circuits. This results in lower cost (lower area usage for given power) or better performance (lower power for a given area). For example, when fabricated using 180 nm process, a circuit in accordance with the present invention encompasses an area one-eight the size of a similar circuit that employs resistors. Compared with known resistor-less circuits, the circuits in accordance with the present invention enable higher accuracy figures because such circuits are insensitive to process and other systematic sources of error.

Cascodes and/or other similar techniques may be added to the circuits in accordance with the invention, if needed, to reduce systematic offset.

To further improve accuracy, trimming structures may be added to the circuits in accordance with the present invention.

The term "coupled", as used herein, is defined as "connected", and encompasses the coupling of devices that may be physically, electrically or communicatively connected, although the coupling may not necessarily be directly, and not necessarily be mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The term "coupled", as used herein, is not intended to be limited to a direct coupling or a mechanical coupling, and that one or more additional elements may be interposed between two elements that are coupled. It is understood that the terms so used are interchangeable under appropriate circumstances such that the embodiments of the invention described herein are, for example, capable of operation in other orientations than those illustrated or otherwise described herein.

The Detailed Description section, and not the Abstract section, is intended to be used to interpret the claims. The Abstract section may set forth one or more but not all embodiments of the invention, and the Abstract section is not intended to limit the invention or the claims in any way.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages or solutions to problems that are described herein with regard to specific embodiments are not intended to be construed as a critical, required, or essential feature or element of any or all the claims.

What is claimed is:

1. A resistor-less amplifying circuit configured to receive an input voltage, comprising:
   a plurality of resistor-less cells comprising MOS transistors; and
   a closed loop around at least one cell, wherein
      a value of a control voltage is adjusted, by feedback through the closed loop,
      each cell generates an output signal of the cell equal to a difference between gate-to-source voltages ($\Delta V_{GS}$) of two MOS transistors,
      a magnitude of $\Delta V_{GS}$ is controlled by the control voltage, and
      the magnitude of $\Delta V_{GS}$ is made equal to the input voltage.

2. The resistor-less amplifying circuit of claim 1, in which an output signal of the resistor-less amplifying circuit consists of a sum of the output signals generated by each cell.

3. The resistor-less amplifying circuit of claim 2, in which the resistor-less amplifying circuit has N cells, and including a closed loop around K cells, where K is less than N.

4. The resistor-less amplifying circuit of claim 3, including a closed loop around one cell.

5. The resistor-less amplifying circuit of claim 4, in which the output signal of the resistor-less amplifying circuit is equal to the input voltage multiplied by an integer.

6. The resistor-less amplifying circuit of claim 3, including a closed loop around two cells.

7. The resistor-less amplifying circuit of claim 6, in which the output signal of the resistor-less amplifying circuit is equal to the input voltage multiplied by a non-integer.

8. The resistor-less amplifying circuit of claim 1, wherein each cell is identical in structure and is biased identically.

9. The resistor-less amplifying circuit of claim 1, in which the input voltage is a differential input voltage, and in which each cell includes:
   a first MOS transistor,
   a second MOS transistor, and
   a third MOS transistor,
   wherein the first and second MOS transistors of each cell generate $\Delta V_{GS}$.

10. The resistor-less amplifying circuit of claim 9, in which the input voltage is a differential input voltage, and in which a first cell includes:
   a first MOS transistor,
   a second MOS transistor having a gate for receiving one end of the differential input voltage, and
   a third MOS transistor,
   and in which the closed loop includes a differential amplifier having an inverting input terminal for receiving another end of the differential input voltage, a non-inverting input terminal coupled to a gate of the first MOS transistor, and an output terminal coupled to a gate of the third MOS transistor.

11. The resistor-less amplifying circuit of claim 10, in which the first MOS transistor has a gate coupled to the non-inverting input terminal of the differential amplifier, and a source terminal coupled to a current source, and is configured as a diode,
   the second MOS transistor has a drain terminal coupled to $V_{DD}$ and a source terminal coupled to the current source, and
   the third MOS transistor has a gate coupled to the output terminal of the differential amplifier, a source terminal coupled to $V_{DD}$ and a drain terminal coupled to drain and gate terminals of the first MOS transistor.

12. The resistor-less amplifying circuit of claim 1, in which the input voltage has proportional-to-absolute-temperature (PTAT) behavior and in which each cell has PTAT behavior.

13. An integrated circuit, comprising:
   a substrate having a bandgap voltage; and
   a bandgap voltage reference circuit disposed on the substrate, the bandgap voltage reference circuit including:
      a plurality of resistor-less cells, each cell including MOS transistors, wherein each cell generates a proportional-to-absolute-temperature (PTAT) voltage and wherein the plurality of cells generates a sum of the PTAT voltages generated by each cell,
      a device, coupled to the plurality of cells, the device having a complementary-to-absolute-temperature (CTAT) voltage associated therewith,
      connections for adding the CTAT voltage and the sum of the PTAT voltages generated by each cell, and
      an output terminal for providing a temperature-independent voltage reference at the bandgap voltage.

14. The integrated circuit of claim 13, in which each cell is identical in structure and is biased identically.

15. The integrated circuit of claim 14, in which each cell includes:
   a first MOS transistor,
   a second MOS transistor having a gate for receiving the CTAT voltage, and
   a third MOS transistor, and
   wherein the PTAT voltage is a difference between a gate-to-source voltage of the first MOS transistor a gate-to-source voltage of the second MOS transistor ($\Delta V_{GS}$).

16. The integrated circuit of claim 15, including a closed loop around at least one cell, wherein a magnitude of $\Delta V_{GS}$ is controlled by feedback through the closed loop.

17. The integrated circuit of claim 16, in which the closed loop includes a differential amplifier having
   an inverting input terminal for receiving another CTAT voltage, a non-inverting input terminal coupled to a gate of the first MOS transistor, and an output terminal coupled to a gate of the third MOS transistor.

18. A bandgap voltage reference circuit for providing a temperature-independent voltage reference ($V_{REF}$), comprising:

a first bipolar junction transistor (BJT) having a first base-to-emitter voltage $V_{BE1}$, and a second BJT having a second base-to-emitter voltage $V_{BE2}$, wherein the first and second bipolar transistors operate at different emitter current densities and generate a $\Delta V_{BE} = |V_{BE1} - V_{BE2}|$;

at least one resistor-less cell including:
a first MOS transistor,
a second MOS transistor having a gate for receiving $V_{BE2}$, and
a third MOS transistor; and a feedback loop including a differential amplifier having an inverting input terminal for receiving $V_{BE1}$, a non-inverting input terminal coupled to a gate of the first MOS transistor, and an output terminal coupled to a gate of the third MOS transistor, wherein each cell generates a difference between a gate-to-source voltage of the first MOS transistor and a gate-to-source voltage of the second MOS transistor ($\Delta V_{GS}$), and wherein a value of a control voltage outputted by the differential amplifier causes $\Delta V_{GS}$ of each cell to equal $\Delta V_{BE}$.

19. The bandgap voltage reference circuit of claim 18, in which each cell is identical in structure and is biased identically.

20. The bandgap voltage reference circuit of claim 18, in which $V_{REF}$ consists of $V_{BE2}$ plus a sum of each $\Delta V_{BE}$ generated by each cell.

* * * * *